United States Patent
Nishimura et al.

(10) Patent No.: US 8,665,916 B2
(45) Date of Patent: Mar. 4, 2014

(54) FIBER LASER

(75) Inventors: Hitoshi Nishimura, Osaka (JP); Hideaki Itoh, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/821,034

(22) PCT Filed: Jun. 14, 2012

(86) PCT No.: PCT/JP2012/003875
§ 371 (c)(1), (2), (4) Date: Mar. 6, 2013

(87) PCT Pub. No.: WO2013/001734
PCT Pub. Date: Jan. 3, 2013

(65) Prior Publication Data
US 2013/0308661 A1    Nov. 21, 2013

(30) Foreign Application Priority Data
Jun. 29, 2011    (JP) ................. 2011-144023

(51) Int. Cl.
*H01S 3/30* (2006.01)
*H01S 3/067* (2006.01)
*H01S 3/0933* (2006.01)
*H01S 3/094* (2006.01)

(52) U.S. Cl.
CPC ............. *H01S 3/067* (2013.01); *H01S 3/06716* (2013.01); *H01S 3/06733* (2013.01); *H01S 3/06745* (2013.01); *H01S 3/0675* (2013.01); *H01S 3/0933* (2013.01); *H01S 3/094003* (2013.01); *H01S 3/094007* (2013.01); *H01S 3/06708* (2013.01)
USPC ............................................. 372/6; 372/102

(58) Field of Classification Search
CPC . H01S 3/067; H01S 3/06716; H01S 3/06733; H01S 3/6745; H01S 3/0675; H01S 3/0933; H01S 3/094003; H01S 3/094007
USPC ............................................................ 372/6
See application file for complete search history.

(56) References Cited

U.S. PATENT DOCUMENTS

| 8,094,689 B1 * | 1/2012 | Koplow ...................... 372/3 |
| 2009/0074362 A1 | 3/2009 | Oba |
| 2013/0016742 A1 * | 1/2013 | Sakamoto ..................... 372/6 |
| 2013/0235895 A1 * | 9/2013 | Mizuuchi et al. ............... 372/92 |

FOREIGN PATENT DOCUMENTS

| JP | 2004-252057 A | 9/2004 |
| JP | 2007-271786 A | 10/2007 |
| JP | 2008-310277 A | 12/2008 |

(Continued)

OTHER PUBLICATIONS

International Search Report for Application No. PCT/JP2012/003875 dated Jul. 10, 2012.

*Primary Examiner* — Dung Nguyen
(74) *Attorney, Agent, or Firm* — RatnerPrestia

(57) ABSTRACT

The optical fiber of the present invention has an input double-clad fiber containing high-reflection FBG, an oscillation double-clad fiber, and an output double-clad fiber containing low-reflection FBG. The output double-clad fiber is formed of a core, a first clad, and a second clad. In the output double-clad fiber, a high refractive-index resin coat section recoated with high refractive-index resin whose refractive index is the same as that of the second clad or greater is disposed at a part where the second clad is partly removed between an output end and the low-reflection FBG. The refractive index of the high refractive-index resin coat section gradually increases along the direction in which light travels through the first clad.

5 Claims, 3 Drawing Sheets

(56) References Cited

FOREIGN PATENT DOCUMENTS

| | | |
|---|---|---|
| JP | 2009-115918 A | 5/2009 |
| JP | 2010-171322 A | 8/2010 |
| JP | 2010-263188 A | 11/2010 |
| JP | 2011-186399 A | 9/2011 |
| WO | WO 2011/067908 A1 | 6/2011 |

* cited by examiner

FIBER LASER

BACKGROUND

This application is a U.S. National Phase Application of PCT International Application PCT/JP2012/003875 filed on Jun. 14, 2012, which claims priority to Japanese Patent Application No. 2011-144023 filed on Jun. 29, 2011. The disclosures of these applications including the specifications, the drawings, and the claims are hereby incorporated by reference in its entirety.

1. Technical Field

The present invention relates to fiber lasers using double-clad fibers, in particular, relates to the structure of a fiber laser capable of removing residual excitation light as unwanted light that is fed together with oscillation light from an optical fiber oscillator.

2. Background Art

For removing residual excitation light in double-clad fibers of a fiber laser, the following related arts have conventionally been suggested.

According to the first one of the related arts, an optical fiber protecting body is provided to protect a fusion splice at which the double-clad fibers are fusion spliced with each other. The protecting body above has an accommodating groove for accommodating the fusion splice therein and a supporting groove for supporting an optical-fiber coat section disposed close to the fusion splice. Besides, the protecting body has a heatsink for converting the light that leaks from the fusion splice into heat and then diffusing the heat into the outside. The fusion splice is covered with resin material so as to be fixed in the accommodating groove. The resin material is made of UV cured resin, allowing the light that leaks from the fusion splice to pass through (see patent literature 1, for example).

The second one of the related arts suggests an optical-fiber fusion splicing structure capable of removing residual excitation light trapped in optical fibers at a fusion splice that connects each end of two optical fibers. According to the structure, the fusion splice is linearly fixed and recoated with a resin whose refractive index is smaller than that of the clad or coating of optical fibers. Further, the resin is coated with a reinforcing sleeve. The fusion splice is thus retained (see patent literature 2, for example).

The conventional arts above, however, have the problems below.

According to the structure of the first related art, residual excitation light is removed by concentration. The UV cured resin covering the fusion splice generally has high refractive index. If residual excitation light to be removed concentrates at a part recoated with such a high refractive-index resin, the resin can be damaged by heat. The structure has insufficiency in consideration to cope with the problem above.

The structure of the second related art has the same problem with that of the first one. As is shown in an exemplary embodiment where an excitation light of 15 W is employed, the structure is suitable for low-output excitation. In the case of high-output excitation greater than several kilowatts, residual excitation light, which is removed at a part recoated with resin, concentrates in the periphery of the fusion splice, resulting in damage to the resin by heat. The structure, too, has insufficiency in consideration to cope with the problem above.

CITATION LIST

Patent Literature

[PTL1]
Japanese Unexamined Patent Application Publication No. 2007-271786
[PTL2]
Japanese Unexamined Patent Application Publication No. 2009-115918

SUMMARY

The present invention provides a fiber laser capable of removing residual excitation light with no thermal damage to high refractive-index resin for recoating.

To address the aforementioned problem, the fiber laser of the present invention has the following structure: an input double-clad fiber containing high-reflection FBG (fiber bragg grating), an oscillation double-clad fiber doped with a rare earth element, and an output double-clad fiber containing low-reflection FBG. At each of the both ends of the oscillation double-clad fiber, the input double-clad fiber and the output double-clad fiber are connected. That is, the oscillation double-clad fiber is disposed between the high-reflection FBG and the low-reflection FBG so as to form a laser resonator. The output double-clad fiber has a core through which light travels, a first clad that surrounds the core, and a second clad that surrounds the first clad and forms the outer periphery. Besides, in the fiber laser of the present invention, a high refractive-index resin coat section is disposed at a part where the second clad is partly removed between the output end and the low-reflection FBG of the output double-clad fiber. The high refractive-index resin coat section has a refractive index the same as that of the second clad or greater. Further, the fiber laser of the present invention has the structure where the refractive index of the high refractive-index resin coat section gradually increases along the direction in which the light travels through the first clad.

The structure above allows unwanted light such as residual excitation light to gradually leak from a wide range in the section recoated with high refractive-index resin. Therefore, in spite of oscillation of excitation light with extremely high output, there is no worry for localization of extremely high temperature in the recoating resin. This enhances the reliability of an assembled fiber laser.

DETAILED DESCRIPTION OF THE PREFERRED EMBODIMENTS

Figure 1:
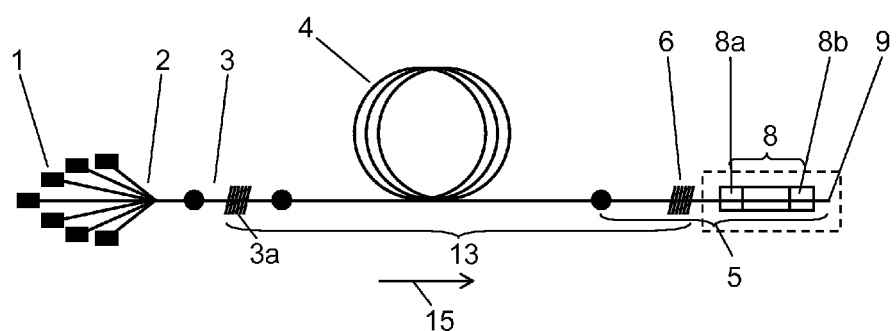
FIG. 1 illustrates the structure of a fiber laser in accordance with a first exemplary embodiment of the present invention, showing a general structure including from the oscillator to the resin coat section.

Hereinafter, an exemplary embodiment of the present invention will be described with reference to accompanying drawings. In the drawings below, like components have the same reference marks and the descriptions thereof may be omitted.

First Exemplary Embodiment

Figure 2:
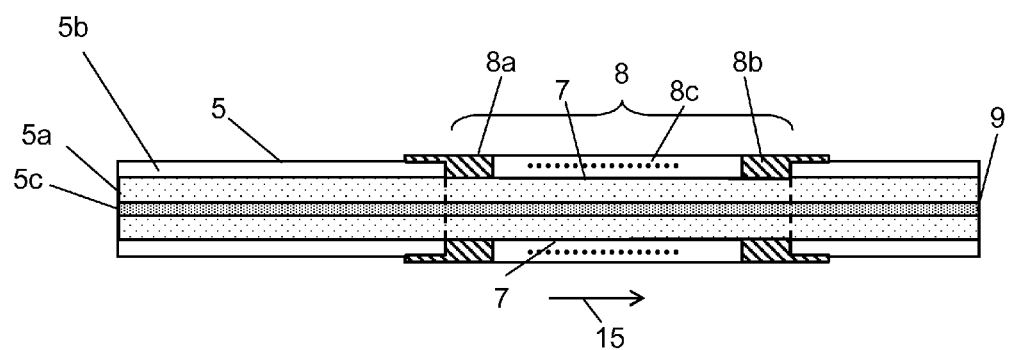
FIG. 2 shows a detailed structure of the high refractive-index resin coat section of the fiber laser in accordance with the first exemplary embodiment of the present invention.

FIG. 1 illustrates the structure (including the high refractive-index resin coat structure), which generally shows from the oscillator to the resin recoated section, of a fiber laser in accordance with the first exemplary embodiment of the present invention. FIG. 2 shows a detailed structure of the high refractive-index resin coat section of the fiber laser in accordance with the first exemplary embodiment of the present invention.

As shown in FIG. 1 and FIG. 2, the fiber laser of the first exemplary embodiment has laser diode 1 for excitation, excitation light coupler 2, input double-clad fiber 3, oscillation double-clad fiber 4, output double-clad fiber 5, low-reflection FBG (fiber bragg grating) 6, second clad removed section 7, high refractive-index resin coat section 8, and output end 9 for oscillation light. Input double-clad fiber 3 contains a bragg diffraction grating as high-reflection FBG 3a, which is formed in core 5c of the fiber. Oscillation double-clad fiber 4 is doped with a rare earth element. Output double-clad fiber 5 contains a bragg diffraction grating as low-reflection FBG 6, which is formed in core 5c of the fiber. High refractive-index resin coat section 8 contains a plurality of regions, for example, region 8a and region 8b. The refractive index of resin coat section 8 is determined to have gradual increase along the direction of light transmission shown by arrow 15. That is, region 8b has a refractive index greater than that of region 8a. Further, in the same region (for example, in region 8b), the refractive index may be determined to have increase along the direction of light transmission shown by arrow 15.

Oscillation double-clad fiber 4 is connected to output double-clad fiber 5 having the low-reflection FBG and input double-clad fiber 3 having the high-reflection FBG so that a resonator for laser oscillation is formed therebetween.

Laser light obtained by laser oscillation is fed from low-reflection FBG 6. Between low-reflection FBG 6 and output end 9 of output double-clad fiber 5, unwanted light travels through first clad 5a. The unwanted light above includes excitation light that cannot be absorbed by oscillation double-clad fiber 4 and oscillation light that leaks from the core glass of oscillation double-clad fiber 4.

At that time, if a leakage of light localizes at a recoated part of high refractive-index resin coat section 8, a large amount of heat is generated at the part, which causes thermal damage to the resin. To prevent a large amount of localized heat generation, the fiber laser of the first exemplary embodiment has the structure where the refractive index of high refractive-index resin coat section 8 gradually increases from region 8a toward region 8b. That is, high refractive-index resin coat section 8 is divided into a plurality of regions including regions 8a and 8b along the direction of light transmission shown by arrow 15 so as to prevent a localized leakage of unwanted light. As for region 8c shown in FIG. 2, too, it may be divided into a plurality of regions each of which having a refractive index with a gradual increase toward output end 9.

The refractive index of region 8a in the structure above, which is the lowest value in high refractive-index resin coat section 8, is the same as that of second clad 5b of output double-clad fiber 5. The second clad removed section is recoated with a resin whose refractive index gradually increases from the refractive-index value of second clad 5b toward the direction of light transmission, and finally, the second clad removed section is recoated with a resin having a refractive index higher than that of first clad 5a.

Output double-clad fiber 5 may be structured such that a first fiber where low-reflection FBG 6 is formed in core 5c is connected to a second fiber where high refractive-index resin coat section 8 is disposed. With the structure of output double-clad fiber 5 capable of dividing the first fiber from the second fiber, a second fiber having high refractive-index resin coat section 8 with difference in material or structure can be used according to magnitude of light output fed from output end 9.

Figure 3:
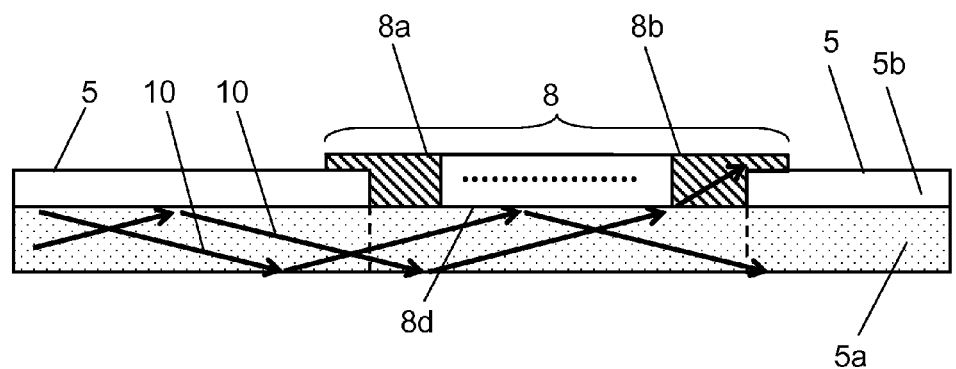
FIG. 3 shows the structure of workings as an example of the fiber laser in accordance with the first exemplary embodiment of the present invention.
Figure 4:
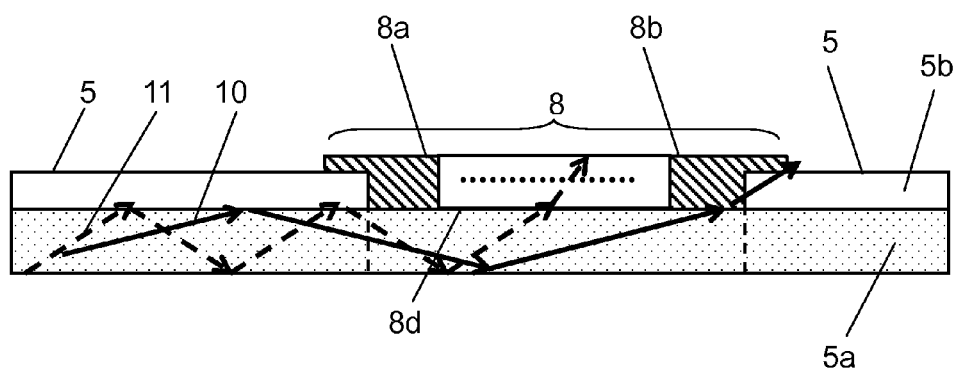
FIG. 4 shows the structure of workings as another example of the fiber laser in accordance with the first exemplary embodiment of the present invention.

The workings of the fiber laser with the structure above of the first exemplary embodiment will be described hereinafter, referencing FIG. 3 and FIG. 4. Each of FIG. 3 and FIG. 4 shows an example of the workings of the fiber laser in accordance with the first exemplary embodiment of the present invention. Of unwanted light traveling through output double-clad fiber 5, the arrows shown in FIG. 3 indicate light 10 of low-order mode that travels through first clad 5a. Light 10 of low-order mode enters, with a shallow incident angle, into coat surface 8d of high refractive-index resin coat section 8. Therefore, in region 8a where the refractive index is relatively low, light 10 reflects off coat surface 8d and travels through first clad 5a. In contrast, in region 8b having an increased refractive index of high refractive-index resin coat section 8, light 10 of low-order mode has no refection and leaks from output double-clad fiber 5, as shown in FIG. 3. That is, light 10 of low-order mode travels through first clad 5a and high refractive-index resin coat section 8, and then goes out from output double-clad fiber 5.

Of unwanted light, FIG. 4 shows propagation of light 11 of high-order mode (indicated by dashed lines), together with light 10 of low-order mode (indicated by solid lines) shown in FIG. 3.

Light 11 of high-order mode enters, with an incident angle steeper than that of light 10 of low-order mode, into coat surface 8d of high refractive-index resin coat section 8. Light 11 has therefore no reflection at region 8a with a lower refractive index and leaks from output double-clad fiber 5.

As described above, when unwanted light leaks from output double-clad fiber 5, the region of high refractive-index resin coat section 8 from which the unwanted light leaks depends on the mode of unwanted light: the high-order mode or the low-order mode. It will be understood that, the higher the mode of unwanted light, the closer to region 8a of high refractive-index resin coat section 8 the unwanted light leaks from output double-clad fiber 5.

Suppose that the lowest refractive index of a region in region 8a, region 8b, and region 8c of high refractive-index resin coat section 8 is the same as the refractive index of second clad 5b of output double-clad fiber 5, and the refractive index has a gradual increase from the refractive-index value of second clad 5b along the direction of light transmission. In that case, of unwanted light traveling through first clad 5a of output double-clad fiber 5, light of the highest-order mode leaks from the periphery of region 8a of high refractive-index resin coat section 8 to the outside of outside output double-clad fiber 5.

The refractive index of region 8b of high refractive-index resin coat section 8 is determined to be greater than that of first clad 5a, which allows unwanted light, even light of the lowest-order mode, to leak from output double-clad fiber 5 to the outside.

With the structure above, leakage of light gradually occurs, according to the mode of unwanted light, in a range from region 8a to region 8b of high refractive-index resin coat section 8. As a result, unwanted light is removed from an extensive range of high refractive-index resin coat section 8 with no leakage of light concentrated to a certain part. The structure thus prevents concentration of leakage of light.

The refractive index of high refractive-index resin coat section 8 of recoated resin may have continuous change or stepwise change from region 8a through region 8b to region 8c.

In the structure above, the unwanted light led into high refractive-index resin coat section 8 of recoated resin has to be discharged as heat.

The fiber laser of the first exemplary embodiment has input double-clad fiber 3 containing high-reflection FBG 3a, oscillation double-clad fiber 4 doped with a rare earth element, and output double-clad fiber 5 containing low-reflection FBG 6. At each of the both ends of oscillation double-clad fiber 4, input double-clad fiber 3 and output double-clad fiber 5 are connected. That is, oscillation double-clad fiber 4 is disposed between high-reflection FBG 3a and low-reflection FBG 6 so as to form laser resonator 13. Output double-clad fiber 5 has core 5c through which light travels, first clad 5a that surrounds core 5c, and second clad 5b that surrounds first clad 5a and forms the outer periphery. Besides, in the fiber laser of the first exemplary embodiment, high refractive-index resin coat section 8 recoated with resin having high refractive index is disposed at a part where second clad 5b is partly removed between output end 9 and low-reflection FBG 6 of output double-clad fiber 5. High refractive-index resin coat section 8 has a refractive index the same as that of second clad 5b or greater. Further, the fiber laser of the first exemplary embodiment has the structure where the refractive index of high refractive-index resin coat section 8 gradually increases along the direction in which the light travels through first clad 5a.

The structure above allows unwanted light such as residual excitation light to gradually leak from a wide range in the area recoated with resin having high refractive index. Therefore, in spite of oscillation of excitation light with extremely high output, there is no worry about localization of an extremely high temperature in the resin. This enhances the reliability of an assembled fiber laser.

Besides, laser diode 1 and excitation light coupler 2 may be disposed as light source for excitation. In that case, laser diode 1 and excitation light coupler 2 are connected to the input end of input double-clad fiber 3.

The structure above allows excitation light to be efficiently fed to oscillation double-clad fiber 4, providing a fiber laser with high conversion efficiency of output to input.

High refractive-index resin coat section 8 may be formed of regions 8a, 8b, and 8c, and the refractive index of each region may be determined to have gradual increase along the direction in which light travels through first clad 5a.

The structure above prevents concentration of unwanted light to a certain part of high refractive-index resin coat section 8. Unwanted light including residual excitation light gradually leaks from a wide range in the region recoated with resin having high refractive index. Therefore, no worry about localization of extremely high temperature in the region recoated with resin. This enhances the reliability of an assembled fiber laser.

Figure 5:
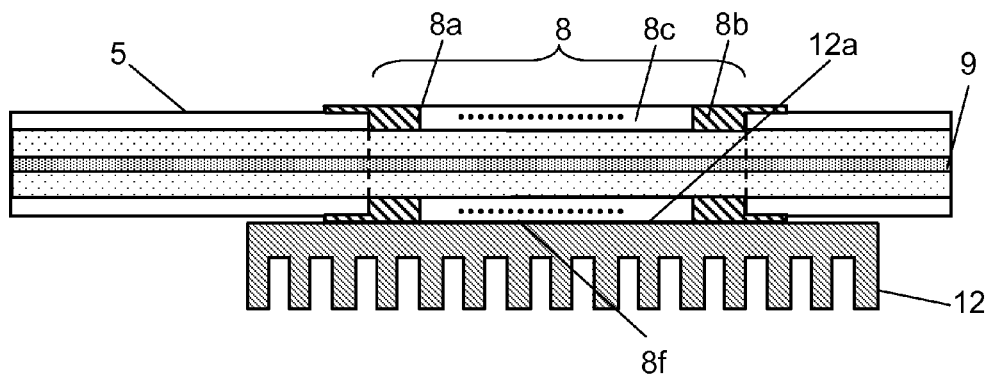
FIG. 5 generally shows the structure where a heatsink metallic component is disposed on the resin coat section of the fiber laser in accordance with the first exemplary embodiment of the present invention.

FIG. 5 generally shows the structure where heatsink metallic component 12 is disposed on high refractive-index resin coat section 8 as the resin coat section of the fiber laser of the first exemplary embodiment of the present invention. To discharge unwanted light from all over heatsink metallic component 12 as heat, as shown in FIG. 5, contact surface 12a of heatsink metallic component 12 should preferably make contact with a large area of surface 8f of high refractive-index resin coat section 8. Heatsink metallic component 12 to be contacted with surface 8f should preferably be undergone surface treatment, for example, black aluminum anodizing, so as to easily absorb unwanted light. In addition, metallic component 12 should preferably have a forced-cooling system by a heatsink structure, an air-cooling fan, a heat pipe, water cooling, and the like. Absorbing the light entered into resin, heat-absorbing components, such as metallic component 12, accept it as heat and then efficiently dissipate the heat into surrounding air.

Although double-clad fibers 3, 4, and 5 employed for the present invention are optical fibers of circular cross section, it is not limited to; double-clad fibers 3, 4, and 5 of noncircular or rectangular cross section offer the same effect.

The present invention is not necessarily used for removing propagating light of cladding mode fed from an oscillator; it is also effective in removing propagation light of cladding mode generated by an optical amplifier and offers the same effect.

EXAMPLE 1

Hereinafter, a specific example of the present invention will be described in detail.

As for laser diode 1, 19 single emitter laser diodes were employed (where, each diode offers 915 nm of center wavelength of output light and standard output of 12 W). A taper bundle fiber coupler in which 19-fiber-bundled quarts fiber (NA=0.15) provides output to a single-line fiber (NA=0.46) was employed for excitation light coupler 2.

As for oscillation double-clad fiber 4, a double-clad fiber having a single-mode core doped with Ytteribium (Yb) as a rare earth element was employed. Input double-clad fiber 3 having high-reflection FBG 3a therein and output double-clad fiber 5 having low-reflection FBG 6 therein were fusion spliced to each end of oscillation double-clad fiber 4 to form a fiber laser oscillator. In the fiber laser oscillator, FBG 3a and FBG 6 serve as a reflection mirror each other.

A resin having a refractive index of 1.38 was used for second clad 5b of double-clad fibers 3, 4, and 5. Numerical aperture (NA) of first clad 5a measured approximately 0.46. Low refractive-index resin, which was employed for second clad 5b, was removed by a thickness of approximately 100 mm from its surface to expose first clad 5a. The exposed surface of first clad 5a was recoated with high refractive-index resin coat section 8.

The high refractive-index resin for recoating was formed of silicone resin for fiber coating or optical component gel. The refractive index of the silicone resin ranged from 1.38 to 1.50. The silicone resin was successively applied in the order of increasing refractive index along the direction of light propagation and then cured. Regions 8a, 8b, and 8c were thus formed. That is, the high refractive-index resin may be silicone resin. The material has a refractive index similar to that of fiber and is excellent in workability, coating properties, and heat resistance.

Such structured fiber laser was oscillated by an excitation light of 230 W, and an oscillation light of 140 W or more was fed from output end 9 of the fiber laser as the core; meanwhile, an unwanted light of approximately 20 W was removed at second clad removed section 7 recoated with high refractive-index resin coat section 8. At that time, the region that removed unwanted light retained the maximum temperature not greater than 50° C. The sample in the state above was monitored. Even after 100 hours, no deterioration in the resin or abnormalities in appearance was found. From the result, it can be said that unwanted light is absorbed at high refractive-index resin coat section 8 with no concentration to a certain region and heat is uniformly generated all over high refractive-index resin coat section 8. Even under oscillation by excitation light with an extremely high output of 230 W, unwanted light including residual excitation light gradually leaks from a wide range in the region recoated with high refractive-index resin. Therefore, there is no worry about localization of an extremely high temperature in the region recoated with resin. This provides an assembled fiber laser with an enhanced reliability and increased lifetime.

COMPARATIVE EXAMPLE

For comparison purposes, fiber-coating resin with a refractive index of 1.46 only was employed for the high refractive-index resin with which second clad removed section 7 was recoated.

As in the case of example 1, a fiber laser was oscillated by an excitation light of 230 W. Before long, localized increase in temperature was observed in the unwanted-light removing section, and the temperature exceeded 100° C. in a few seconds. The sample in the state above was monitored. After 30 minutes, abnormalities in appearance were found—the coating resin changed into yellow. The result of the comparative example apparently shows the advantages of the fiber laser of the first exemplary embodiment. That is, no worry about localization of an extremely high temperature in the region recoated with resin. This provides an assembled fiber laser with an enhanced reliability and increased lifetime.

INDUSTRIAL APPLICABILITY

The fiber laser of the present invention maintains stable operation for a long time with no degradation of fibers. It is therefore suitable for a laser device for machining.

What is claimed is:

1. A fiber laser comprising:
an input double-clad fiber containing high-reflection FBG;
an oscillation double-clad fiber doped with a rare earth element; and
an output double-clad fiber containing low-reflection FBG,
wherein, at both ends of the oscillation double-clad fiber, the input double-clad fiber and the output double-clad fiber are connected so as to structure a laser resonator formed of the oscillation double-clad fiber disposed between the high-reflection FBG and the low-reflection FBG,
the output double-clad fiber having:
a core through which light travels;
a first clad for surrounding the core, and
a second clad for surrounding the first clad so as to form an outer periphery,
wherein, a high refractive-index resin coat section recoated with high refractive-index resin whose refractive index is the same as a refractive index of the second clad or greater is disposed at a part where the second clad is partly removed between an output end and the low-reflection FBG of the output double-clad fiber, and
the refractive index of the high refractive-index resin coat section gradually increases along a direction in which light travels through the first clad.

2. The fiber laser of claim 1 further including a laser diode and a excitation light coupler as light source for excitation, wherein the laser diode and the excitation light coupler are connected to an input end of the input double-clad fiber.

3. The fiber laser of claim 1, wherein the output double-clad fiber is structured such that a first fiber where the low-reflection FBG is formed in the core is connected to a second fiber where the high refractive-index resin coat section is disposed.

4. The fiber laser of claim 1, wherein the high refractive-index coat resin is silicone resin.

5. The fiber laser of claim 1, wherein the high refractive-index resin coat section is formed of a plurality of regions, and each of the regions has a refractive index having a gradual increase along a direction in which light travels through the first clad.

* * * * *